(12) United States Patent
Lacey, Jr.

(10) Patent No.: US 6,997,049 B2
(45) Date of Patent: Feb. 14, 2006

(54) WIND TUNNEL AND COLLECTOR CONFIGURATION THEREFOR

(75) Inventor: John J. Lacey, Jr., Minnetonka, MN (US)

(73) Assignee: Aero Systems Engineering, Inc., St. Paul, MN (US)

( * ) Notice: Subject to any disclaimer, the term of this patent is extended or adjusted under 35 U.S.C. 154(b) by 0 days.

(21) Appl. No.: 10/701,003

(22) Filed: Nov. 4, 2003

(65) Prior Publication Data

US 2004/0089065 A1    May 13, 2004

Related U.S. Application Data

(63) Continuation-in-part of application No. 10/229,890, filed on Aug. 28, 2002, now Pat. No. 6,825,517.

(60) Provisional application No. 60/315,605, filed on Aug. 29, 2001.

(51) Int. Cl.
*G01M 9/00*    (2006.01)

(52) U.S. Cl. ..................................... 73/147

(58) Field of Classification Search ................ 73/147

See application file for complete search history.

(56) References Cited

U.S. PATENT DOCUMENTS

| 5,025,659 A | 6/1991 | Starr, Jr. et al. |
| 5,341,676 A * | 8/1994 | Gouterman et al. ........... 73/147 |
| 5,405,106 A * | 4/1995 | Chintamani et al. ...... 244/23 D |
| 5,435,175 A | 7/1995 | Kramer et al. |
| 6,725,912 B1 * | 4/2004 | Moll et al. .................. 165/144 |
| 2003/0070479 A1 | 4/2003 | Lacey, Jr. |

FOREIGN PATENT DOCUMENTS

| JP | 05026762 | 2/1993 |
| JP | 06201512 | 7/1994 |
| WO | WO 89/03977 | 5/1989 |

OTHER PUBLICATIONS

K.K. Ahuja, "Aeroacoustic Performance of Open-Jet Wind Tunnels with Particular Reference to Jet/Collector Interactions", GTRI Project A-9730, May 1994-Oct. 1994, 25pgs.
Rennie, Mark, "Effect of Jet Length on Pressure Fluctuations in ¾ Open-Jet Wind Tunnels", Internet Article, www.aiolos.com/news/paperspublished.asp, Nov. 5, 2002 (8pgs).

* cited by examiner

*Primary Examiner*—Edward Lefkowitz
*Assistant Examiner*—Jermaine Jenkins
(74) *Attorney, Agent, or Firm*—Dorsey & Whitney LLP (57) ABSTRACT

An open jet wind tunnel having a test section, a nozzle exit and a collector in which the leading edge of the collector is configured with at least a portion being non-uniformly spaced from the nozzle exit.

21 Claims, 9 Drawing Sheets

WIND TUNNEL AND COLLECTOR CONFIGURATION THEREFOR

This application is a continuation-in-part of U.S. patent application Ser. No. 10/229,890 filed Aug. 28, 2002 now U.S. Pat. No. 6,825,517 which claims the benefit of Provisional Application Ser. No. 60/315,605 filed Aug. 29, 2001.

BACKGROUND OF THE INVENTION

1. Field of the Art

The present invention relates generally to a wind tunnel and to a collector design therefor, and more particularly to an open jet wind tunnel with a collector design to reduce resonance in aerodynamic and acoustic testing applications. The invention also relates to a method of providing a wind tunnel and exposing test objects to the wind tunnel air flow for aerodynamic and acoustic testing.

2. Description of the Prior Art

An existing and well-recognized problem with many open jet wind tunnels is the pulsing or resonance which occurs at various frequencies under certain operating conditions. Open jet wind tunnels are used extensively in the automotive industry and various other industries for the purpose of determining aerodynamic forces on a test vehicle or other object and for the purpose of determining the effect of air flow on the aerodynamic and acoustic performance of a particular vehicle design. A typical configuration of an open jet wind tunnel includes a test section often comprising a large room or other closed configuration, a nozzle at the upstream end of the test section and a collector at the downstream end of the test section. Generated air flow flows along a flow path from the nozzle, across the test section and into the collector. During a test, the vehicle or other object to be tested is positioned in the test section within the air flow.

An observed problem with many open jet wind tunnels which often restricts their use at certain air speeds includes a pulsing phenomenon or resonance which occurs at such air speeds. This pulsing or resonance, in some cases, may simply make the air flow and the floor pressures unsteady or variable so as to adversely affect the air flow past the test object. This can result in inaccurate and thus unreliable data. In other cases, the pulsing or resonance may be strong enough to damage the building structure. Various authorities have recognized this problem in open jet wind tunnels and have speculated that such pulsing phenomenon or resonance is directly related to test section air speeds and wind tunnel dimensions and that the mechanism that excites such resonance involves the interaction of vortices of air flow from the nozzle to the collector. It has also been speculated that decreasing the length of the test section at a given air speed will have the tendency to reduce resonances at that air speed. However, this is a limitation on the capability of the system and is often not an option because of the test section length needed for a particular application. Accordingly, to the extent that this problem has been addressed, it has been primarily addressed by adjusting air speeds and/or wind tunnel and test section dimensions in an attempt to avoid the undesirable resonance problems. The result, however, is that this merely changes the frequency or air speed conditions at which the resonance or the pulsing phenomenon occurs or places other significant limitations upon the system.

Even when resonance problems have been addressed as provided above, utilization of a wind tunnel for providing air flow tests on a test object such as a vehicle involves providing a wind tunnel with a certain size, including nozzle size and test section length relative to the test vehicle, so that it accurately and reliably simulates road conditions for the particular vehicle performance parameter being tested. This is particularly critical when the wind tunnel is being used in the aerodynamic and acoustic testing of vehicles as discussed below.

Automotive designers and manufacturers utilize open jet wind tunnels to test vehicle performance in various performance areas. One such area involves evaluating or testing the effect of air flow on its ability to cool the vehicle engine. This is sometimes referred to as "climatic" testing or testing conducted in "climatic" wind tunnels. In climatic testing, the designer is concerned primarily with the cooling effect of air flow at the "A" pillar (the front) of the vehicle where the air enters the engine area or other air intake and is less concerned, if at all, with any aerodynamic or acoustic effect the air flow may have on the vehicle. Thus, a wide range of wind tunnel sizes (in terms of nozzle size relative to vehicle size and test section length relative to nozzle size) can be used for climatic wind tunnel testing on vehicles.

A second performance area involves evaluating or testing the aerodynamic and acoustic effect of the air flow as it flows past the vehicle. In aerodynamic and acoustic testing, the design of windshield wipers, the design of radio antennas, the overall exterior configuration of the vehicle from the front to the rear, the effect of open vs. closed windows, etc. are important. As a result, wind tunnels designed for use in, or used in, the aerodynamic and acoustic testing of vehicles requires careful design to ensure accurate simulation of road conditions at the applicable speeds and thus reliable design data. Thus, in contrast to wind tunnels used for climatic testing purposes, wind tunnels used for aerodynamic and acoustic testing purposes have heretofore required a relatively narrow range of wind tunnel sizes (in terms of nozzle size relative to vehicle size and test section length relative to nozzle size).

In general, for wind tunnels utilized in aerodynamic and acoustic testing purposes, the size of the nozzle opening and the distance between the nozzle and the collector (the test section length), and thus the overall size of the wind tunnel, is dictated by the size of the test object or vehicle. Specifically, to achieve accurate and reliable results and to avoid resonance problems for aerodynamic and acoustic testing, the consensus is that the "blockage" of the test object (the cross-sectional area of the test object in the air flow) should not exceed 10% of the nozzle opening and that the overall length of the test section should not exceed about three to three and one-half times the hydraulic diameter of the nozzle opening. Thus, a test object with a "blockage" of twenty-five square feet (25 sq. ft.$^2$) requires a nozzle opening of at least about 250 ft.$^2$ (and thus at least a hydraulic diameter of about 16 ft.) and an overall test section length no more than 48 to 56 feet for reliable aerodynamic and acoustic testing. In many cases, this significantly limits the length of the test object or vehicle that can be tested in that particular wind tunnel.

Accordingly, there is a need in the art for a wind tunnel construction, and in particular an open jet wind tunnels for aerodynamic and acoustic testing of vehicles or the like, which not only minimizes, but preferably eliminates, resonance problems for desired air speed and the wind tunnel dimensions, and which provides improved space efficiency and thus reduced capital and operating expenses.

SUMMARY OF THE INVENTION

In contrast to the prior art, the present invention is directed to an open jet wind tunnel design, and more particularly to a collector design and a combination collector/nozzle design for use in such wind tunnel, which minimizes, if not eliminates, resonance problems such as those described above for particular applications, such as the aerodynamic and acoustic testing of vehicles, while at the same time facilitating a significant reduction in the size of the wind tunnel for a particular application.

Specifically, the present invention focuses on the belief that the resonance is created at various frequencies as a result of eddies or other air flow between the exit edge of the nozzle exit and the leading edge of the collector. In conventional collector design, these edges are all uniformly spaced from one another. Thus, the speculation is that they combine their energies to excite and result in the undesirable resonance. In accordance with the present invention, the collector is designed and configured so that the spacing between the exit nozzle and the leading edge of the collector varies (or is non-uniform) from point to point along the collector edge. Thus, there is insufficient energy at any one frequency to excite an undesirable resonance.

In accordance with a preferred embodiment of the present invention, one or more sections of the leading edge of the collector are sloped relative to the exit nozzle and relative to a vertical plane orthogonal to the flow path of the air. Thus, air flowing from the exit nozzle toward the collector strikes the leading edge of the collector at different times because of the non-uniform spacing and therefore limits or suppresses the generation of undesirable resonance. In a most preferred embodiment of the invention, the leading edge of the collector includes a top edge section which is uniformly spaced from the exit nozzle, and a pair of sloping side edge sections which slope downwardly and away from the top section and thus results in a leading edge in which the distance from such edge to the exit nozzle or the above mentioned plane is non-uniform.

The invention also includes combining the collector design with a nozzle configuration which provides a substantially ordered air flow as it exits the nozzle opening. In the preferred embodiment, this ordered air flow is provided by a nozzle outlet end or extender which is of a substantially uniform cross-sectional area for a distance measured in the direction of air flow of at least about one-half of the hydraulic diameter of the nozzle opening.

With this combination collector and nozzle design, the overall wind tunnel size can be significantly reduced for a given test object or vehicle size, or the size of the test object that can be reliably tested can be significantly increased for a given size wind tunnel.

Accordingly, it is an object of the present invention to provide an improved open jet wind tunnel.

Another object of the present invention is to provide an open jet wind tunnel with a configuration which, minimizes, if not eliminates, undesirable resonance.

A further object of the present invention is to provide an open jet wind tunnel with an improved collector design which minimizes, if not eliminates, undesirable resonance.

A still further object of the present invention is to provide a collector design for an open jet wind tunnel in which points along the leading edge of the collector are non-uniformly spaced from the nozzle.

Another object of the present invention is to provide a wind tunnel with a combination collector and nozzle design which facilitates a significant reduction in wind tunnel size for aerodynamic and acoustic testing purposes.

Another object of the present invention is to provide an improved method of testing a test object in a wind tunnel for aerodynamic and acoustic testing purposes.

These and other objects of the present invention will become apparent with reference to the drawings, the description of the preferred embodiment and method and the appended claims.

DESCRIPTION OF THE PREFERRED EMBODIMENT AND METHOD

The present invention relates generally to an open jet wind tunnel design and more particularly to a wind tunnel design having a collector design and a combination collector/nozzle design which substantially reduces or eliminates resonance problems and which also facilitates significant reduction in overall wind tunnel size for a given test object size or facilitates testing of significantly larger test objects for a given wind tunnel size. Although the open jet wind tunnel of the present invention has a variety of applications and can be used in virtually any application to test the reaction of a test object to an air flow, it has particular application to the automotive industry for aerodynamic and acoustic testing of automobile and other vehicle configurations in air flows ranging from approximately 5 miles per hour to as high as 200 miles per hour or more. In such applications, the test object is an automobile or other vehicle with a cross-sectional area measured perpendicular to the path of the air flow. This cross-sectional area for a test vehicle ranges from about 15 to 120 square feet, more preferably from about 15 to 75 square feet and most preferably from about 15 to 50 square feet. Such test vehicle also has a length dimension measured parallel to the path of the air flow which ranges from about 10 to 60 feet and more preferably from about 10 to 40 feet.

Throughout the application, the term "blockage" as applied to the test object or vehicle and the term "hydraulic diameter" of the nozzle opening will be used. As used herein, unless otherwise specified, the term "blockage" as applied to a test object shall be the maximum cross-sectional area of such test object as measured in a direction perpendicular to the air flow path through the test section. As used herein, unless otherwise specified, the term "hydraulic diameter" as applied to the nozzle opening will be the area of the nozzle opening multiplied by four and then divided by the perimeter of the nozzle opening. With this definition of hydraulic diameter, the hydraulic diameter of a circle will be its diameter and the hydraulic diameter of a square will be the length of one of its sides. The term "aerodynamic and acoustic" testing of a vehicle or other test object, unless otherwise specified, shall mean setting up, collecting and evaluating air flow and acoustic data resulting from positioning the test vehicle or other object in a wind tunnel at applicable air flow speeds.

Figure 1:
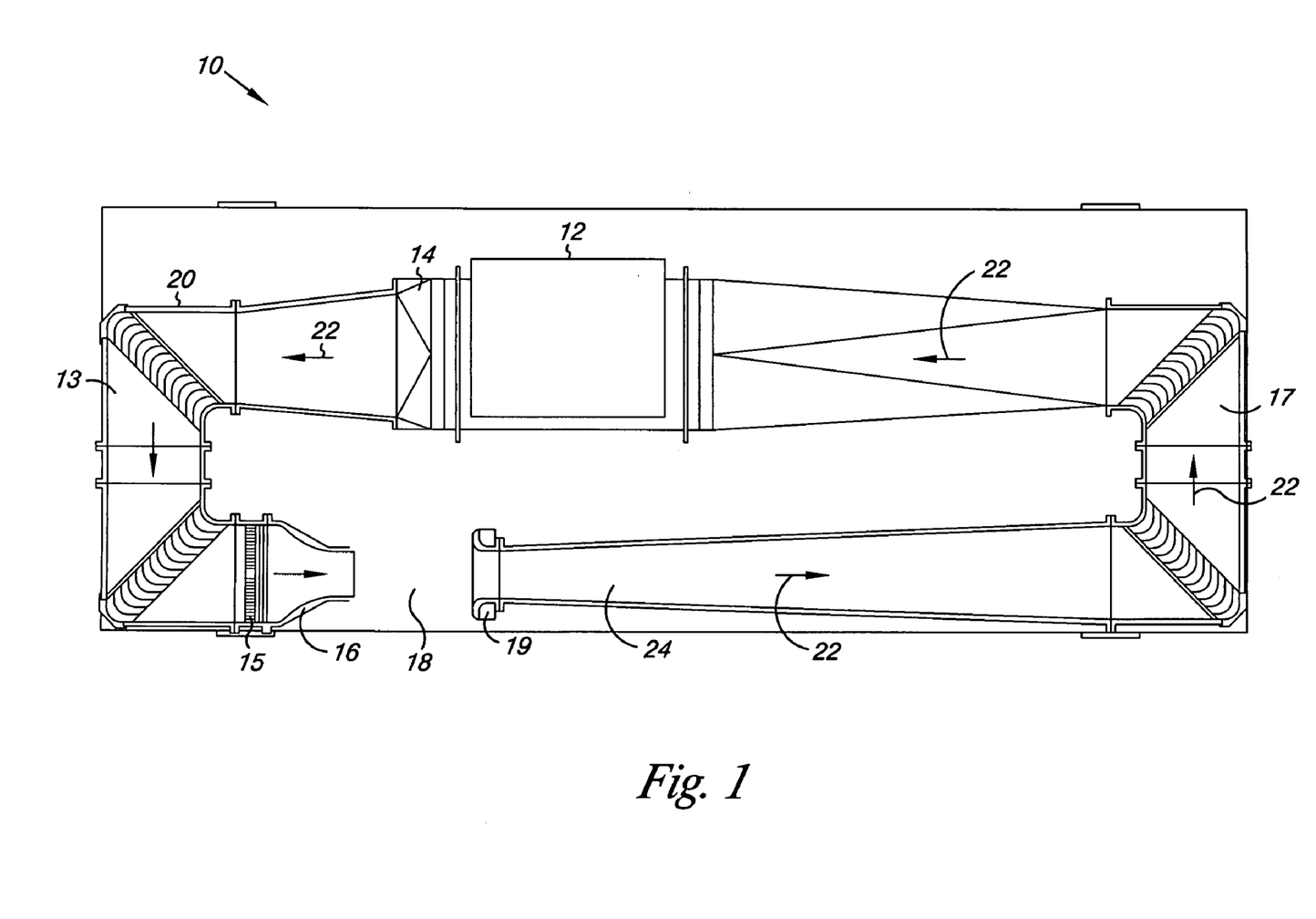
FIG. 1 is a plan view of the wind tunnel in accordance with the present invention.

Reference is first made to FIG. 1 showing a top plan view of the wind tunnel in accordance with the present invention. The wind tunnel 10 includes a flow generator means which is commonly in the form of a fan 12, a heat exchanger or heat exchanger assembly 14, a plurality of turning vanes 13 and 17, one or more flow conditioning elements 15, a nozzle 16, a test section 18 and a collector 19. During operation, the fan 12 is driven by a motor drive to create a high velocity air flow stream 22 in the flow duct 20. The actual air speed which is generated varies greatly depending on the intended use for the wind tunnel; however, typical values range from as low as 5 miles per hour or lower to several times the speed of sound. Although the wind tunnel of the present invention has a variety of applications, it has particular applicability to providing aerodynamic and acoustic testing for the automotive industry. When used in connection with the automotive industry, the air speed normally ranges from about 5 to 200 miles per hour.

The preferred embodiment utilizes a fan to accelerate the air because of its ability to move large volumes of air. However, those skilled in the art will realize that various alternate flow generating means can be used as well such as blowers, compressors, diffusers, nozzles, vacuum tanks, high pressure storage chambers and various combinations thereof.

The motor drive powers the flow generator or fan 12. Because some of the energy supplied by the motor drive and the fan 12 is converted into heat, a heat exchanger 14 is provided. The temperature of the air leaving the heat exchanger 14 will vary depending upon the intended application of the wind tunnel and the velocity of the air flow involved; however, a typical temperature for air exiting the heat exchanger 14 for automotive applications is in the range of −50 to +60° C. After leaving the heat exchanger, the air flow stream 22 travels through the turning vane 13 which changes the flow direction of the flow stream 180 degrees and into the flow conditioning elements 15. The flow conditioning elements 15 straighten the flow stream 22 to further reduce any turbulence. The preferred embodiment contemplates the use of a honey comb style flow straightener. However, depending upon the wind tunnel application, the flow conditioning elements could be eliminated or replaced by other devices.

Upon leaving the flow conditioning elements 15, the flow stream 22 is further accelerated through the nozzle 16 before exiting the nozzle and entering the test section 18. During use, the flow stream 22 passes over a test object in the test section 18 before being returned by the collector 19 to the flow duct 24, through the turning vane 17 and back to the flow generator 12.

In the preferred embodiment the wind tunnel is a closed circuit wind tunnel in which the wind (or air) is continuously circulated through the system along the air flow stream. It is understood, however, that many of the concepts and features of the present invention may be equally applicable to wind tunnels which are not of the closed circuit type. In actual construction and use, the test section 18 is defined by a test section room or containment which totally surrounds the test section 18 and is larger than the nozzle 16 and the collector 19.

Figure 2:
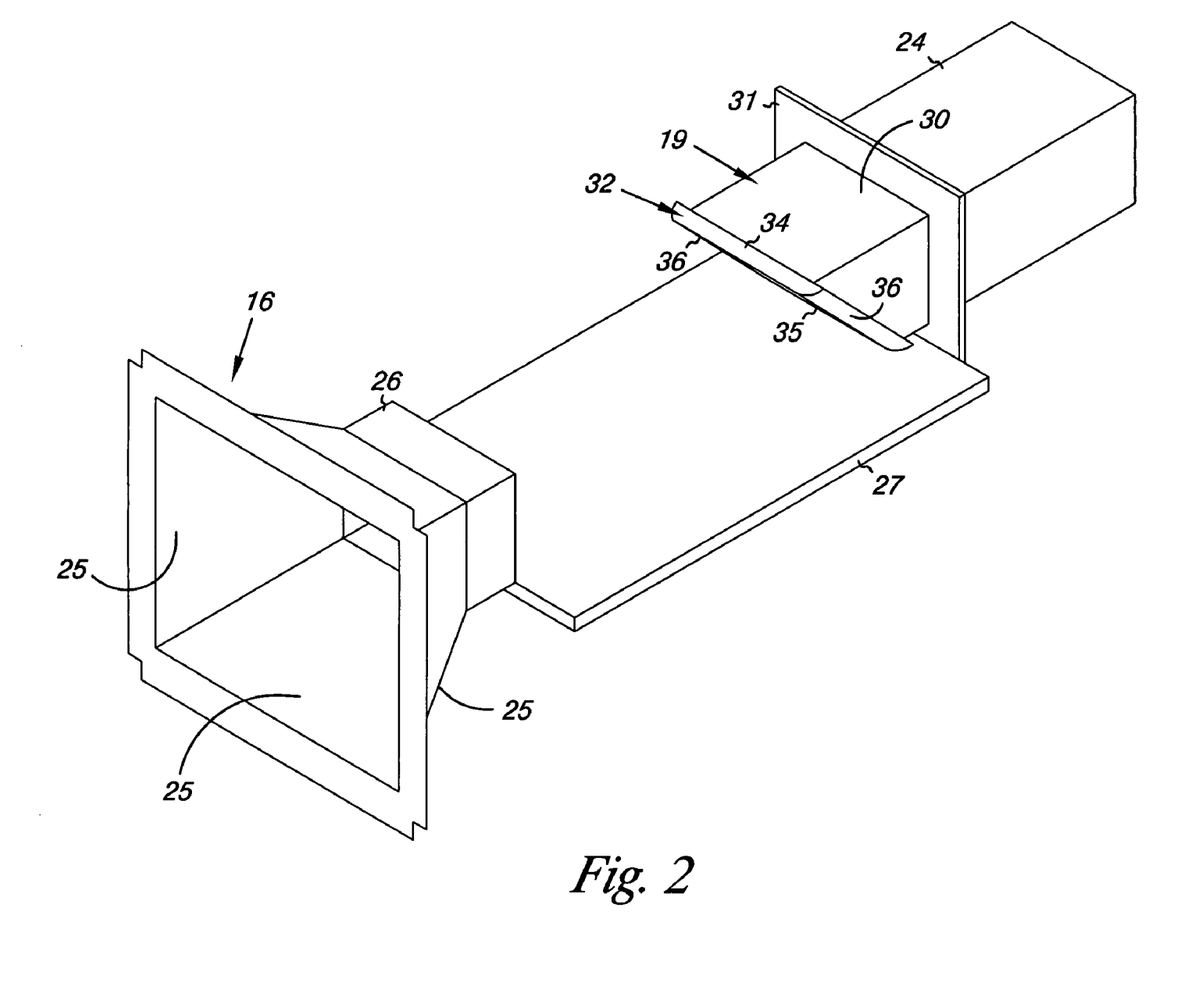
FIG. 2 is an isometric view of the test section components of the wind tunnel showing the nozzle, the test section and the collector.
Figure 3:
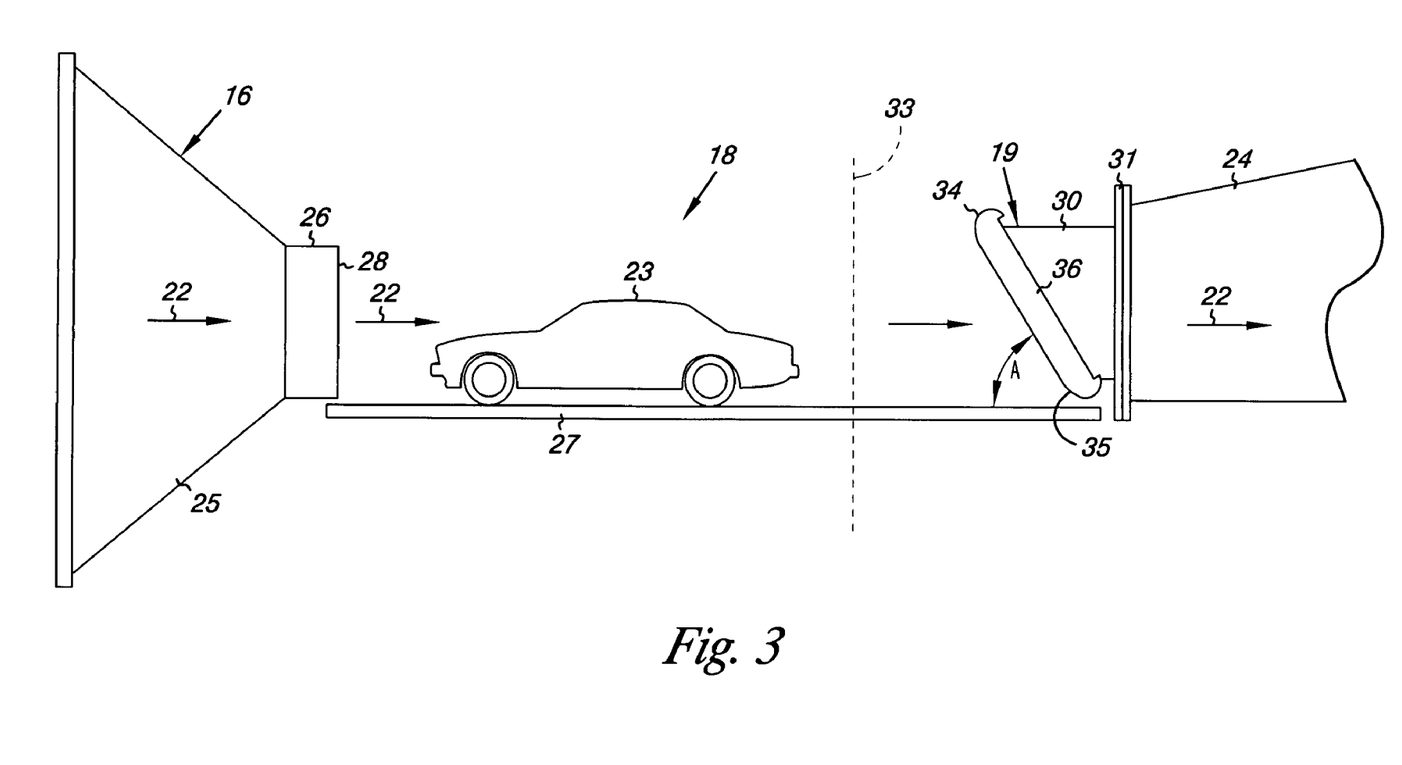
FIG. 3 is an elevational side view of the test section components of the wind tunnel.
Figure 4:
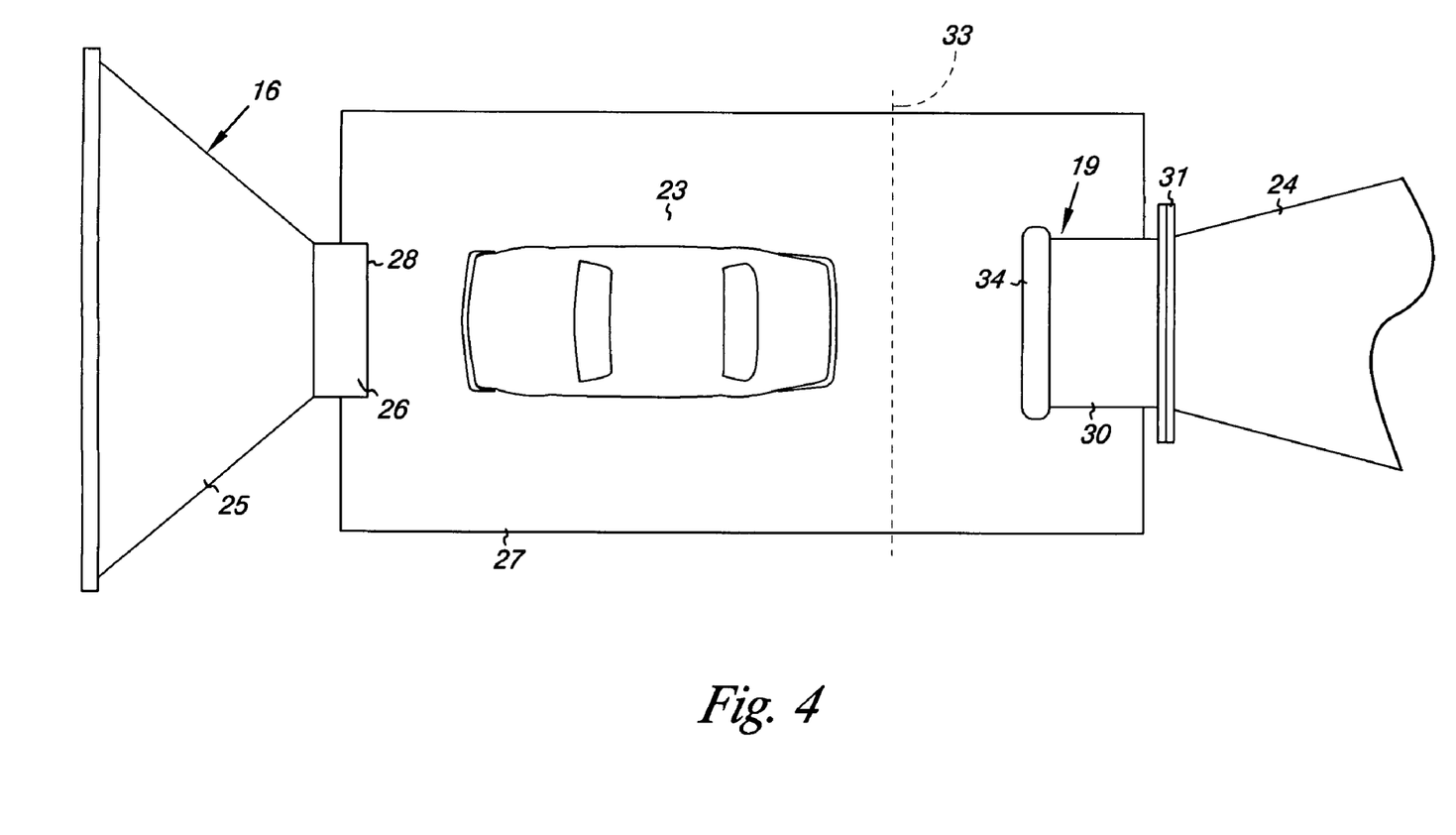
FIG. 4 is a plan view of the test section components of the wind tunnel.
Figure 11:
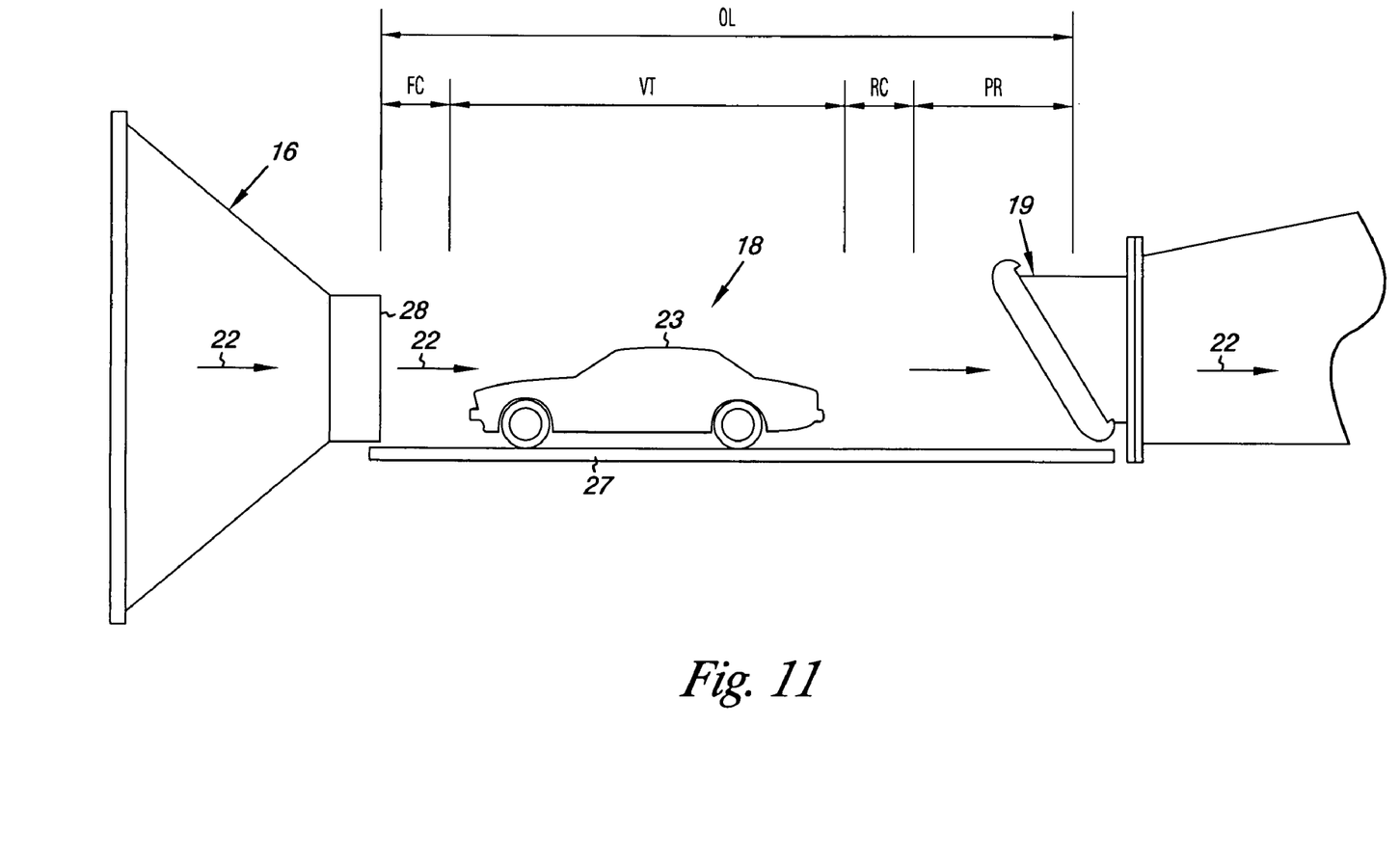
FIG. 11 is a further elevational side view of test section components of a wind tunnel.
Figure 12A:
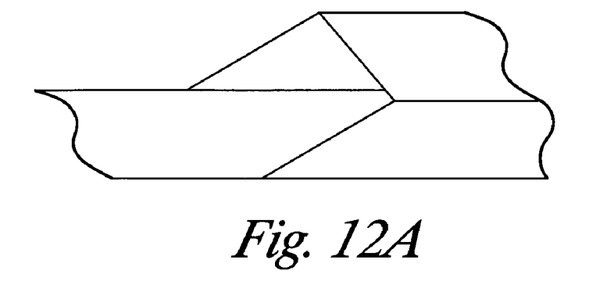
FIGS. 12A, 12B, 12C and 12D are schematic illustrations of various leading edge configurations.
Figure 12B:
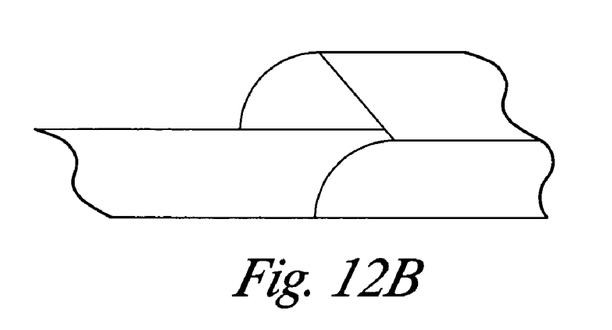
Figure 12C:
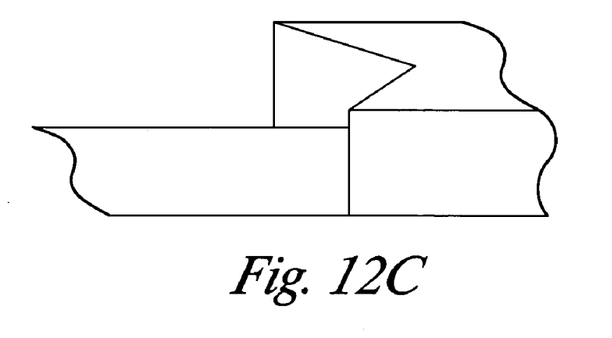
Figure 12D:
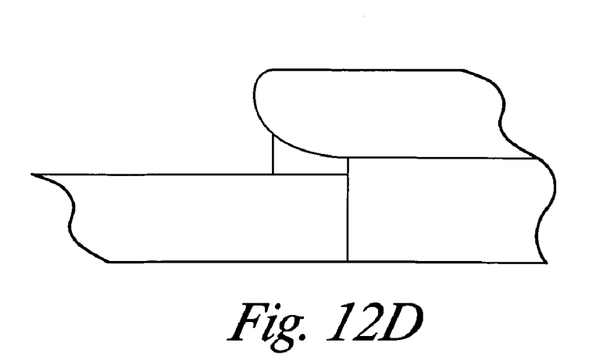

Reference is next made to FIGS. 2, 3 and 11 illustrating the test area components of the wind tunnel. These comprise the nozzle or tunnel assembly 16, the test section 18 and the collector 19. With specific reference to FIG. 11, the overall length OL of the test section 18 extends from the outlet end of the nozzle 16 to the inlet at the base of the collector 19. This test section length OL is comprised of a forward clearance length FC, a vehicle test length VT, a rear clearance length RC and a pressure rise length PR. FIGS. 3 and 11 also show a test vehicle or object 23 located in the test section 18. As used herein, the vehicle test length VT shall mean the maximum vehicle length that can be tested while still obtaining accurate and reliable aerodynamic and acoustic test data.

In general, as air flows from the nozzle opening through the test section 18, the distance FC is required to avoid influence of the vehicle on the nozzle flow and to ensure minimal influence of the nozzle on the measurements on the vehicle. In general, it is expected that the front clearance length FC for most wind tunnels will be about three-fourths of the hydraulic diameter of the nozzle opening. After the air flow passes the test vehicle 23 with a length which may be less than but which may not exceed the vehicle test length VT, a certain distance is needed in the form of the rear clearance length RC to avoid influence of the pressure rise on the measurements on the vehicle. Following this, the pressure begins to increase in the area PR as the air approaches the collector 19. In general, the combined length of the sections RC and PR in most wind tunnels is expected to be about one to three times the hydraulic diameter of the nozzle opening.

Figure 5:
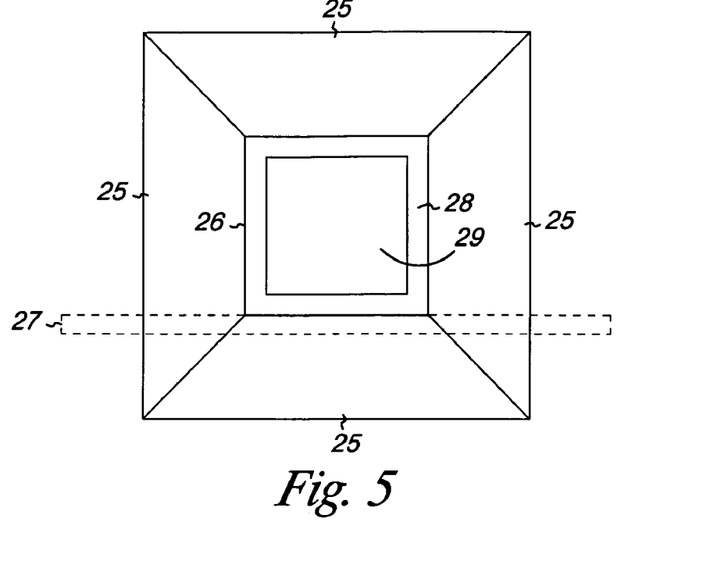
FIG. 5 is an elevational end view of the nozzle, as viewed in the upstream direction, in accordance with the present invention.

With reference to FIGS. 2, 3, 4 and 5, the nozzle or tunnel assembly 16 includes a plurality of sloping walls 25 which converge in the direction of the air flow 22 toward a nozzle exit member 26. The nozzle exit member 26 includes a side wall which extends generally parallel to the air flow for a short distance and terminates at an air flow exit end 28 (FIG. 5). The air flow exit end 28 defines the air flow exit opening 29 through which the air flow passes before being exposed to the test object 23. In the preferred embodiment, the exit end 28 lies in a plane generally perpendicular or orthogonal to the movement of the air flow 22 through the nozzle assembly 16. The nozzle 16 of the preferred embodiment includes four shaped and converging walls 25 to accelerate the air flow and four side walls defining the nozzle exit member 26. Thus, the cross sectional configuration of the nozzle assembly 16 cut along a plane generally orthogonal to the air flow is rectangular. Such cross sectional configuration, and thus the number and configuration of the walls 25 and 26, however, may be modified depending upon the characteristics of air flow desired and the specific application of the wind tunnel.

Figure 9:
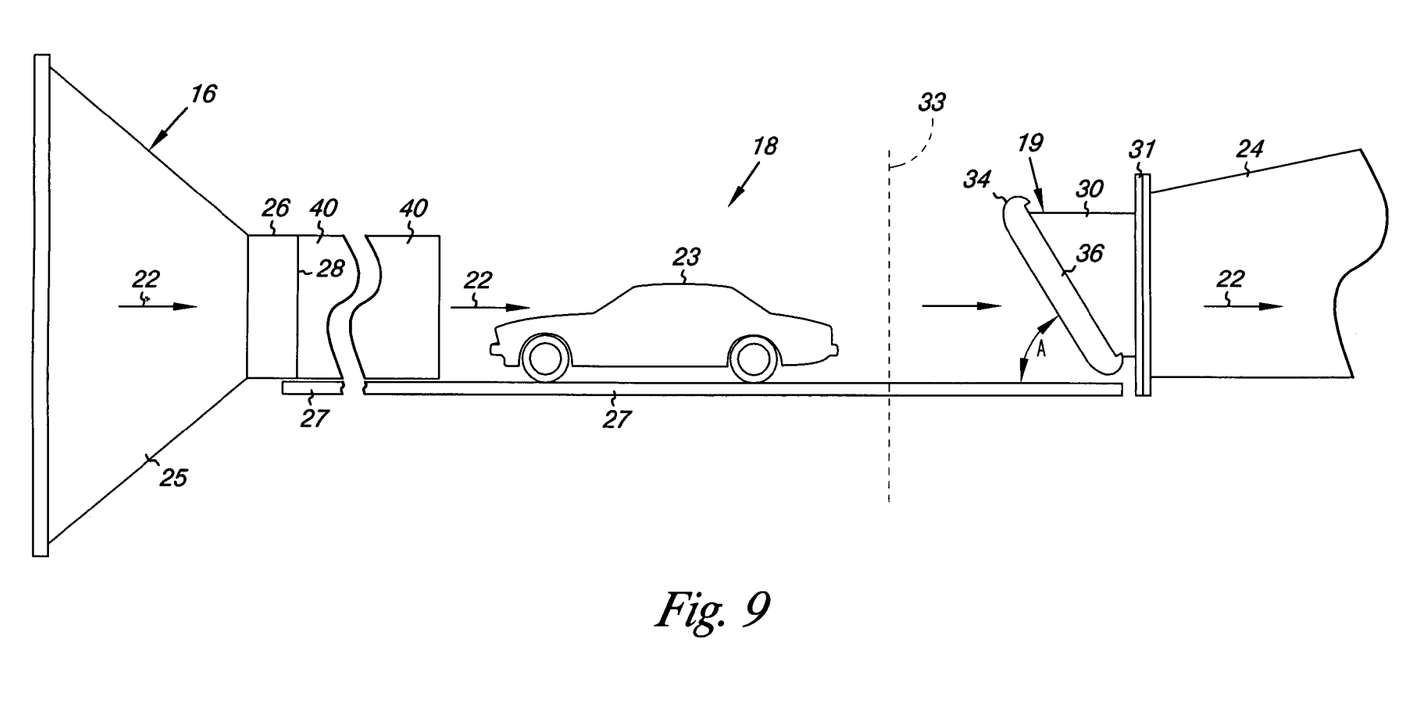
FIG. 9 is an elevational side view of the wind tunnel, similar to FIG. 3, but showing nozzle extenders.

If desired, nozzle extenders 40 as shown in FIG. 9 can be utilized to vary the length of the test section 18 so as to accommodate certain test vehicles or objects and to control resonances at certain air flow speeds as will be discussed in greater detail below. The nozzle extenders 40 are generally tubular elements having a preferred cross-sectional size and configuration substantially matching that of the nozzle outlet 28 and a length which provides the desired air flow characteristics (and elimination of resonances) at the desired air flow speed, test section length and collector configuration.

In general, the preferred embodiment of the present invention contemplates a nozzle end in the form of the nozzle exit member 26 (FIGS. 2 and 3) or the nozzle extender 40 (FIG. 9) which is of sufficient length relative to the size of the nozzle opening 29 (FIG. 5) to provide a substantially ordered air flow as the air leaves the end 28 of the nozzle. By the term "ordered", it is meant that the air flow which exits from the end 28 of the nozzle exhibits a substantially uniform velocity profile. In other words, the velocity of the air flowing from the end 28 of the nozzle is substantially uniform over substantially the entirety of the nozzle opening 29. It is recognized that this is a matter of degree; however, a substantially uniform velocity profile will be established if the length of the nozzle exit member 26 and/or the nozzle extender 40 have a length which is at least one quarter of the hydraulic diameter of the nozzle opening and more preferably at least about one half the hydraulic diameter of the nozzle opening. Most preferably, the length of the nozzle exit member 26 or the nozzle extenders 40 should be about three fourths of the hydraulic diameter of the nozzle opening or more. In the preferred embodiment, the nozzle exit member 26 and the nozzle extender 40 have a substantially constant or uniform cross-sectional configuration and size throughout the entirety of their length.

The test section 18 includes a base 27 which upon the test object 23 may be mounted and is positioned between the nozzle 16 (or the nozzle extender 40 of FIG. 9) and the collector 19. The test section includes an upstream end adjacent to the nozzle 16 and a downstream end adjacent to the collector 19. The test object 23 such as a vehicle or the like is positioned on, or mounted to, the base 27, in a conventional manner. During use, the air flow 22 flows from the nozzle 16 (or nozzle extender 40), across the test section 18 and to the collector 19 in the direction of the flow path 22. In some applications, where the test object is suspended from above or supported on a post or the like, the base 27 may be eliminated.

Figure 6:
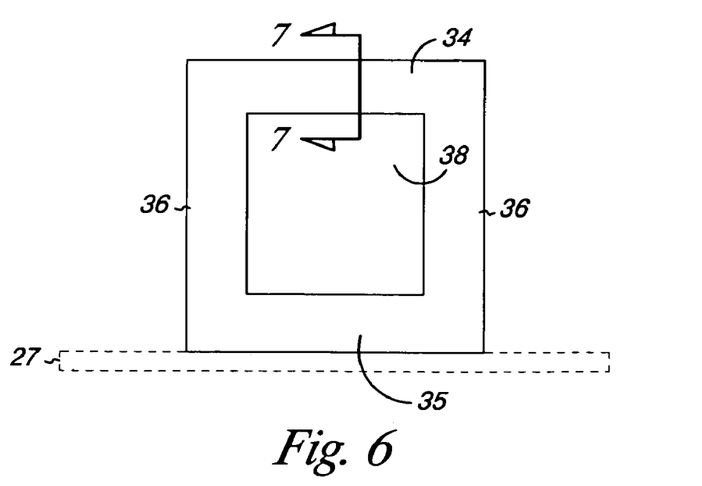
FIG. 6 is an elevational end view of the collector, as viewed in the downstream direction, in accordance with the present invention.

The collector 19 is the structural element of the wind tunnel which is positioned adjacent the downstream end of the test section 18 and functions to return the air flow to the return duct 24. The collector 19 includes a collector housing 30 having a rearward flange or bracket 31 for connecting the collector 19 to the return flow duct 24. In the preferred embodiment, the housing 30 forms a generally tubular configuration with walls extending rearwardly from the leading edge of the collector 19 in a direction generally parallel to the air flow 22 in the test section 18. The collector 19 also includes a forwardly positioned leading edge 32 which faces upstream relative to the air flow and which thus engages the air flow after it passes the test object. As shown best in FIGS. 2 and 6, the leading edge of the collector includes a plurality of sections, namely, a top section 34, a bottom section 35 and a pair of side sections 36, 36. The plurality of sections 34, 35, 36 and 36 define an air flow inlet opening 38. The opening 38 receives air passing the test object 23 in the test section 18 and returns it to the return duct 24 for recirculation. Wind tunnels with a leading edge on a bottom section such as the section 35 are more common in wind tunnels without a base 27.

As shown best in FIGS. 2 and 3, the leading edge 32 has a configuration in which the top section 34 and bottom section 35 are generally perpendicular to the direction of air flow 22. Thus, points along the section 34 are generally uniformly spaced from the nozzle exit end 28 and points along the section 35 are generally uniformly spaced from the nozzle exit end 28, but at a distance different from one another. In contrast, the side sections 36,36 each slope downwardly and rearwardly (away from the test section 18) at an angle "A" from the top section 34 in the direction of the air flow, Thus, points along the side sections, 36, 36 are not uniformly spaced from the nozzle exit end 28.

Although applicant does not wish to be bound to any particular theory, it is believed that the undesirable resonance and pulsation in existing open jet wind tunnels is a result of eddies or other air flow between the exit edge of the nozzle exit 28 and the leading edge of the collector 19. Because these edges in conventional and existing designs are all substantially uniformly spaced from one another, they combine their energies to excite the undesirable resonance. By modifying the test area structure, and in particular the configuration of the collector 19 and thus the leading edges of the collector 19, so that the distance between the nozzle exit and at least a portion of the leading edges of the collector are not uniformly spaced, there is insufficient energy at any one frequency to excite the resonance. Accordingly, the present invention is directed to providing a wind tunnel test area comprising the nozzle or nozzle exit 16, the test section 18 and the collector 19, in which the space or distance between the exit edge of the nozzle and points along the leading edge of the collector is non-uniform, or which at least includes sections where such space or distance is non-uniform. Thus, the present invention provides a test area including a nozzle with an exit edge and a collector with a leading edge in which the nozzle exit edge and/or the collector leading edge are configured to provide non-uniform spacing between points along the nozzle exit edge and corresponding points along the collector leading edge. Although it is possible for either the nozzle exit edge or the collector leading edge, or both, to be configured to provide this non-uniform spacing, in the preferred embodiment, the points along the nozzle exit edge lie in a common vertical plane. In contrast, the collector leading edge is configured so that points along at least a portion of such edge are non-uniformly spaced from such vertical plane.

Another way of expressing the structure of the present invention is to define the position of the leading edge 32 of the collector 19 relative to an imaginary plane orthogonal to the flow path 22 of the air stream in the test section 18. Such an imaginary plane is illustrated in FIG. 3 by the reference character 33. In the preferred collector structure, the leading edge sections 34 and 35 are generally parallel to such orthogonal plane 33 and thus points along the leading edge sections 34 and 35 are substantially uniformly spaced from the plane 33. However, because the leading edge sections 36, 36 are sloped relative to the plane 33, points along the edge sections 36, 36 are non-uniformly spaced from the orthogonal plane 33. Further, although points along the leading edge section 34 are uniformly spaced from the plane 33 and points along the leading edge section 35 are uniformly spaced from the plane 33, the distances between the points on the edge section 34 and the plane 33 and between the points on the edge section 35 and the plane 33 are different from one another. Thus, in the structure of the preferred embodiment, only a portion (no more than about 60 percent) of the leading edge of the collector 19 is uniformly spaced from the plane 33 or the nozzle exit. More preferably, no more than about 50 percent of the leading edge of the collector 19 should be at a uniform distance from the plane 33 or the nozzle exit, and most preferably, no more than about 40 percent of the leading edge of the collector 19 should be at a uniform distance from the plane 33 or the nozzle exit.

Figure 10:
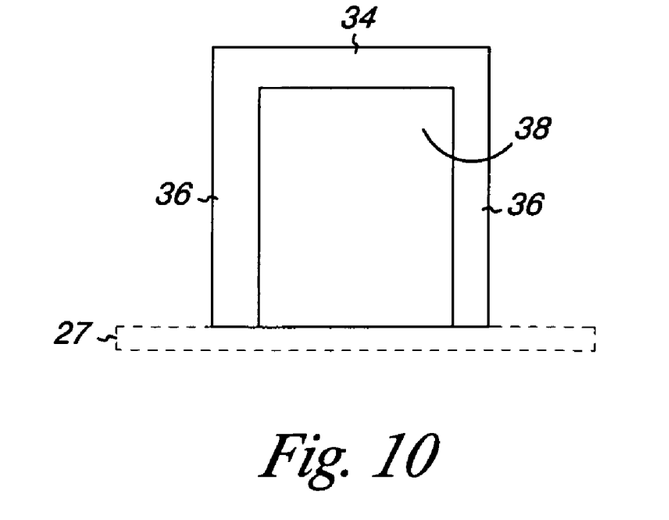
FIG. 10 is an elevational end view of a further embodiment of a collector design in which the bottom lead edge has been eliminated.

It should be noted that an open jet wind tunnel can have four exposed or impact leading edge sections as shown or three exposed or impact leading edge sections as shown in FIGS. 9 and 10 in which the base 27 of the test section is substantially continuous with the bottom entrance to the collector 19 or any of a variety of different configurations having various numbers of exposed or impact leading edge sections. As indicated above, a collector configuration with four leading edge sides (including one on the bottom) is used primarily in open jet wind tunnels without a base 27. The configuration shown in FIGS. 9 and 10 is preferred for wind tunnels with a supporting base 27. Regardless of the number of leading edge sections, the above percentages are intended to apply only to the exposed or impact leading edges.

For purposes of determining whether a leading edge section 34, 35, 36, 36 of the collector 19, or points along a leading edge section are uniformly or non-uniformly spaced from the plane 33 or the nozzle exit, the point considered is the stagnation point or the point at a particular location or cross-section on the leading edge section which is closest to the plane 33 or the nozzle exit. The collection of these points generally follows the periphery of the collector opening 38. Thus, points along the leading edge section 34 would each be uniformly spaced from the plane 33 at a first distance, and points along the leading edge section 35 would be uniformly spaced from the plane 33 at a second distance, but points along the leading edge sections 36, 36 would be non-uniformly spaced from the plane 33.

In the structure of the preferred embodiment shown best in FIG. 3, the angle "A" which the leading edge sections 36, 36 form with the base 27 of the test section 18 (or the flow path 22) may be altered or adjusted to provide optimum and desired results. Specifically, the edge sections 36, 36 slope at an angle other than 90 degrees. No particular angle "A" is necessary to accomplish the objectives of the present invention so long as a portion of the leading edge of the collector is non uniformly spaced from the nozzle exit or the orthogonal plane 33. Thus, for a collector with sloping side edges as shown, the angle "A" should be less than 85°, more preferably less than 75° and most preferably less than 70°. The range of angle "A" which the leading edge sections 36, 36 form with the flow path 22 should preferably be from about 30° to 85°, more preferably from about 40° to 80° and most preferably from about 50° to 75°. Further although the preferred embodiment shows the side edge sections 36, 36 sloping downwardly and rearwardly (away from the test section 18), they could also slope downwardly and forwardly.

Figure 8:
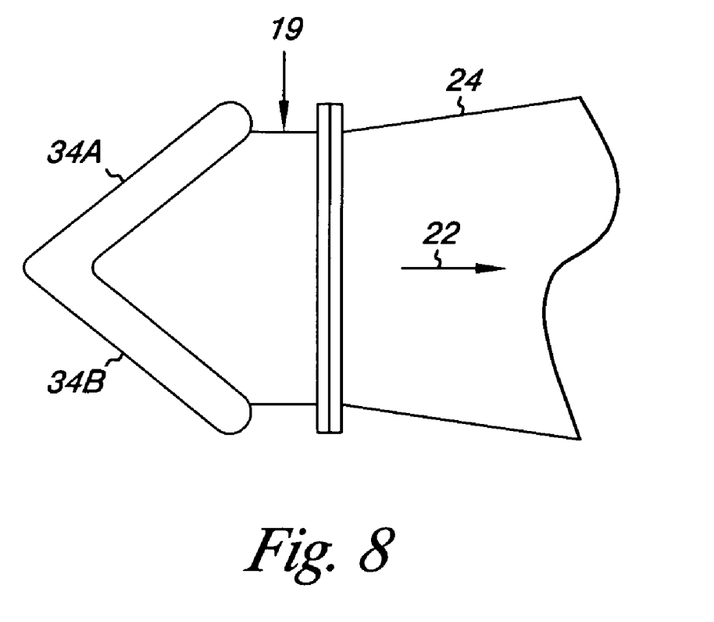
FIG. 8 is a plan view of an alternate embodiment of a collector design.

It is also contemplated that various leading edge configurations, other than the angled side edge configuration shown in FIGS. 2 and 3, may be provided to accomplish the objectives of the present invention. For example, one or more of the edge sections 34, 35, 36, 36 could be curved or provided with any other configuration in which points along those edge sections are spaced at varying, non-uniform distances from the nozzle exit or orthogonal plane 33. FIG. 8 shows a possible alternate embodiment in which the top leading edge section is formed by two portions 34A and 34B. As shown, the edge portions 34A and 34B are sloped at an angle relative to the flow path 22 of the air flow. This top leading edge configuration can be combined with vertical, sloping or curved side edges as well as a horizontal, angled or curved bottom edge. Examples of some possible leading edge configurations are shown schematically in FIGS. 12A, 12B, 12C and 12D, although others are possible as well.

Figure 7:
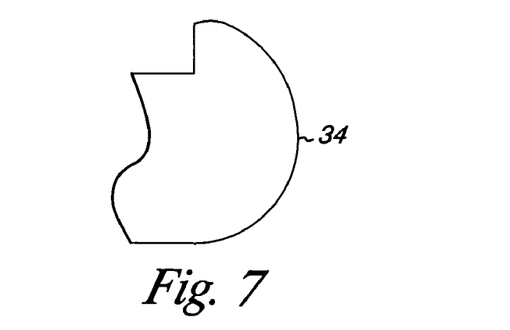
FIG. 7 is a view, partially in section, as viewed along the section line 7—7 of FIG. 6.

The leading edge sections 34, 35, 36, 36 may be comprised of any cross sectional configuration conventional in the art. In the preferred embodiment, as shown in FIG. 7, the cross sectional configuration of the leading edge sections 34, 35, 36, 36 (which are all the same) is a curved configuration of a constant radius.

Although providing the collector leading edges with edge sections which are spaced at non-uniform distances from the exit nozzle or nozzle extender function to reduce the resonances formed in the test section, experimental results indicate that the ability of such a collector design to reduce or eliminate such resonances will depend not only on the particular angle "A" at which the side edge sections 36, 36 are positioned, but also will depend on the length of the test section 18 (the distance from the nozzle exit 28 to the leading edge of the collector) as well as the existence of nozzle extenders 40 or exit members 26 or other means to provide substantially ordered flow exiting the nozzle. Specifically, for a given air flow speed, resonances are eliminated by a collector with side edges at a certain angle "A" up to a certain test section length. As that length is increased beyond that certain length, resonances will again begin to appear. These resonances can, however, be eliminated by decreasing the angle "A" which the side edges 36, 36 of the collector form with the air flow direction or by providing a more ordered air flow exiting the nozzle.

Thus, a collector design such as that shown in the drawings will reduce resonances in a test section over a collector design in which all leading edges are uniformly spaced from the nozzle exit, but only up to a certain test section length. As the angle "A" is decreased from 90° (which would define a structure in which all leading edges are uniformly spaced from the nozzle exit), resonances will be reduced or eliminated for a given air speed up to a certain length. If it is desired to increase the test section length, the angle "A" of the edge sections 36, 36 is decreased or more ordered air flow is provided at the nozzle exit.

Accordingly, by varying the angle at which the side edges 36, 36 are sloped relative to the air flow direction, by varying the test section length by adjusting the position of the nozzle 16 and/or collector 19 or by utilizing nozzle extenders 40, nozzle exit members 26 or other means to provide more ordered air flow at the nozzle exit, the resonances for a particular application and particular air flow speed can be effectively reduced or eliminated. Thus, a method in accordance with the present invention includes providing a wind tunnel with a nozzle and a collector with at least a portion of the leading edge of the collector being non-uniformly spaced from the nozzle and varying the test section length, varying the angle of the leading edge sections of the collector and/or providing a more ordered air flow at the nozzle exit to reduce or eliminate the resonances at a given air speed to an acceptable level.

Although the description of the preferred embodiment and method has been quite specific, it is contemplated that various modifications could be made without deviating from the spirit of the present invention. Accordingly, it is intended that the scope of the present invention be dictated by the appended claims rather than by the description of the preferred embodiment.

What is claimed is:

1. An open jet wind tunnel for aerodynamic and acoustic testing comprising:
a nozzle having a nozzle opening with a nozzle opening area, a nozzle opening perimeter and a hydraulic diameter defined by multiplying the nozzle opening area by four and then dividing by the nozzle opening perimeter wherein the position of said nozzle opening is substantially fixed;
a collector having a leading edge defining a collector inlet opening wherein portions of said leading edge and corresponding portions of said nozzle opening are non-uniformly spaced from one another; and
said nozzle and said collector spaced from one another to define a test section between said nozzle opening and said collector inlet opening, wherein said test section has a length dimension four times or greater than the hydraulic diameter of said nozzle opening.

2. The wind tunnel of claim 1 wherein at least a portion of said leading edge is non-uniformly spaced from said nozzle opening.

3. The wind tunnel of claim 2 wherein said leading edge includes a top section and a pair of side sections extending from opposite ends of said top section.

4. The wind tunnel of claim 3 including an air flow path extending from said nozzle opening to said collector inlet opening wherein at least one of said side sections slopes at an angle other than 90 degrees relative to said air flow path.

5. The wind tunnel of claim 4 wherein said at least one said side section slopes at an angle of between about 30 and 85 degrees.

6. The wind tunnel for aerodynamic and acoustic testing comprising:
a nozzle having a nozzle opening with a nozzle opening area, a nozzle opening perimeter and a hydraulic diameter defined by multiplying the nozzle opening area by four and then dividing by the nozzle opening perimeter;
a collector having a leading edge defining a collector inlet opening;
an air flow path extending from said nozzle opening to said collector inlet opening wherein at least a portion of said leading edge is non-uniformly spaced from said nozzle opening and said leading edge includes a top section and a pair of side sections extending from opposite ends of said top section wherein at least one of said side sections slopes at an angle other than 90 degrees relative to said air flow path and specifically at an angle of between about 30 and 85 degrees and wherein said at least one said side section slopes from said top section downwardly and away from said test section; and
said nozzle and said collector spaced from one another to define a test section between said nozzle opening and said collector inlet opening; wherein said test section has a length dimension four times or greater than the hydraulic diameter of said nozzle opening.

7. The wind tunnel for aerodynamic and acoustic testing comprising:
a nozzle having a nozzle opening with a nozzle open area, a nozzle opening perimeter and a hydraulic diameter defined by multiplying the nozzle opening area by four and then dividing by the nozzle opening perimeter;
a collector having a leading edge defining a collector inlet opening wherein at least a portion of said leading edge is non-uniformly spaced from said nozzle opening and said leading edge includes a top section and a pair of side sections extending from opposite ends of said top section and wherein said at least one side section slopes from said top section downwardly and away from said test section; and
said nozzle and said collector spaced from one another to define a test section between said nozzle opening and said collector inlet opening, wherein said test section has a length dimension four times or greater than the hydraulic diameter of said nozzle opening.

8. The wind tunnel for aerodynamic and acoustic testing comprising:
a nozzle having nozzle opening with a nozzle opening area, a nozzle opening perimeter and a hydraulic diameter defined by multiplying the nozzle opening area by four and then dividing by the nozzle opening perimeter wherein said nozzle includes an end section with a length dimension greater than one-quarter of the hydraulic diameter of said nozzle opening and with a substantially uniform cross-sectional area approximating said nozzle opening area throughout the length dimension of said end section;
a collector having a leading edge defining a collector inlet opening wherein at least a portion of said leading edge is non-uniformly spaced from said nozzle opening; and
said nozzle and said collector spaced from one another to define a test section between said nozzle opening and said collector inlet opening, wherein said test section has a length dimension four times or greater than the hydraulic diameter of said nozzle opening.

9. The wind tunnel of claim 8 wherein the length dimension of said end section is greater than one-half the hydraulic diameter of said nozzle opening.

10. A method of constructing a wind tunnel and testing the effects of air flow past a test vehicle in said wind tunnel comprising:
providing a wind tunnel nozzle having a nozzle opening with a nozzle opening area, a nozzle opening perimeter and a hydraulic diameter defined by multiplying the nozzle opening area by four and then dividing by the nozzle opening perimeter;
providing a test vehicle with a front end, a rear end and a longitudinal axis extending from said front end to said rear end, said test vehicle having a maximum cross-sectional area in a plane perpendicular to said longitudinal axis, said maximum cross-sectional area being greater than 10% of said nozzle opening area;
providing a wind tunnel collector having a base and leading edge defining a collector inlet opening, a portion of said leading edge being non-uniformly spaced from a plane perpendicular to said base;
positioning said wind tunnel nozzle and said wind tunnel collector in spaced relationship to one another so that said nozzle opening and said collector inlet opening face one another and the distance between said nozzle opening and said collector inlet opening defining a wind tunnel test section which is at least four times the hydraulic diameter of said nozzle opening;
positioning said test vehicle in said test section between said nozzle opening and said collector inlet opening; and
providing an air flow through said nozzle opening, past said test vehicle and into said collector inlet opening.

11. The wind tunnel of claim 10 wherein said maximum cross-sectional area is greater than 20% of said nozzle opening area.

12. The wind tunnel of claim 10 wherein said maximum cross-sectional area is greater than 40% of said nozzle opening area.

13. The wind tunnel of claim 10 wherein said test section is at least five times the hydraulic diameter of said nozzle opening.

14. The method of claim 10 wherein said step of providing a wind tunnel nozzle includes providing a wind tunnel nozzle having a nozzle end section with a length dimension being greater than one-quarter of the hydraulic diameter of said nozzle opening and with a substantially uniform cross-sectional area approximating said nozzle opening area throughout said length dimension.

15. The method of claim 14 wherein said length dimension is greater than one-half the hydraulic diameter of said nozzle opening.

16. The method of claim 15 wherein said length dimension is about three-fourths of the hydraulic diameter of said nozzle opening, or greater.

17. An open jet wind tunnel comprising:
a test section having an upstream end and a downstream end;
a nozzle having a nozzle opening positioned at the upstream end of said test section, said nozzle opening including a nozzle opening area, a nozzle opening perimeter and a hydraulic diameter defined by multiplying the nozzle opening area by four and then dividing by the nozzle perimeter, and said nozzle further including an end section with a length dimension greater than one-quarter of the hydraulic diameter of said nozzle opening and with a substantially uniform cross-sectional area approximating said nozzle opening area throughout the length dimension of said end section; and
a collector spaced from said nozzle and having a leading edge non-uniformly spaced from said nozzle opening.

18. The wind tunnel of claim 17 wherein the length dimension of said end section is greater than one-half the hydraulic diameter of said nozzle opening.

19. The wind tunnel of claim 18 wherein said leading edge includes a top section and a pair of side sections extending from opposite ends of said top section.

20. The wind tunnel of claim 19 including an air flow path extending from said nozzle opening to said collector inlet opening and wherein at least one of said side sections slopes at an about 30 to 85 degrees relative to said air flow path.

21. A method of aerodynamic and acoustic testing of an automotive vehicle comprising:
providing an open jet wind tunnel having a nozzle, a collector and a test section between said nozzle and said collector, said nozzle having a nozzle exit area defined by a nozzle opening whose position is substantially fixed and said collector having a leading edge with a portion being non-uniformly spaced from said nozzle opening;
providing a test automotive vehicle having an exterior configuration and positioning said vehicle in said test section;
providing an air flow of about 5 to 200 miles per hour from said nozzle, through said test section past said vehicle;
collecting air flow and acoustic data resulting from said air flow past said vehicle; and
evaluating said air flow and acoustic data.

* * * * *

UNITED STATES PATENT AND TRADEMARK OFFICE
CERTIFICATE OF CORRECTION

PATENT NO. : 6,997,049 B2 Page 1 of 1
APPLICATION NO. : 10/701003
DATED : February 14, 2006
INVENTOR(S) : John J. Lacey, Jr.

It is certified that error appears in the above-identified patent and that said Letters Patent is hereby corrected as shown below:

On Title Page, Item (63) should read
In the Priority Application serial number reads "10/229890"    Should read --10/229898--

Signed and Sealed this

Twelfth Day of December, 2006

JON W. DUDAS
*Director of the United States Patent and Trademark Office*